(12) United States Patent
Teterwak

(10) Patent No.: US 6,927,714 B1
(45) Date of Patent: Aug. 9, 2005

(54) CURRENT STEERING DIGITAL-TO-ANALOG (DAC) CONVERTER WITH IMPROVED DYNAMIC PERFORMANCE

(75) Inventor: Jerzy A. Teterwak, Colorado Springs, CO (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/813,124

(22) Filed: Mar. 31, 2004

(51) Int. Cl.[7] .............................................. H03M 1/00
(52) U.S. Cl. ...................................... 341/136; 341/144
(58) Field of Search ................................ 341/136, 144, 341/119, 127, 118, 154; 330/253

(56) References Cited

U.S. PATENT DOCUMENTS

| | | | | |
|---|---|---|---|---|
| 4,683,458 | A | * | 7/1987 | Hallgren ...................... 341/127 |
| 5,243,347 | A | * | 9/1993 | Jackson et al. ............. 341/144 |
| 5,293,166 | A | * | 3/1994 | Ta ............................... 341/118 |
| 5,548,288 | A | * | 8/1996 | Lueng .......................... 341/136 |
| 5,790,060 | A | * | 8/1998 | Tesch .......................... 341/119 |
| 6,304,201 | B1 | * | 10/2001 | Moreland et al. ........... 341/154 |
| 6,445,322 | B2 | * | 9/2002 | Watson ........................ 341/144 |
| 6,496,129 | B2 | * | 12/2002 | Dedic et al. ................. 341/144 |
| 6,696,894 | B1 | * | 2/2004 | Huang ......................... 330/253 |

OTHER PUBLICATIONS

Yao et al. (U.S. Appl. No. 09/749,976) "A current steering DAC and unit cell", filed on Dec. 28, 2000.*

* cited by examiner

Primary Examiner—Jean Bruner Jeanglaude
(74) Attorney, Agent, or Firm—Crowell & Moring LLP

(57) ABSTRACT

A current steering digital-to-analog (DAC) having improved dynamic performance and output signal quality (i.e. improved SFDR characteristic). The DAC includes current steering segments each having differential transistors to steer a current from a summing node to either the positive or negative output. The DAC further comprises a control circuit to reduce the variation of the voltage present at each summing node. More specifically, the control circuit includes a first circuit that controls the threshold voltage of the corresponding differential transistors that are electrically connected to the positive output in response to the sensed positive output voltage such that the voltages at the corresponding summing nodes remain constant. Similarly, the control circuit includes a second circuit that controls the threshold voltage of the differential transistors that are electrically connected to the negative output in response to the sensed negative output voltage such that the voltages of the corresponding summing nodes remain constant.

46 Claims, 2 Drawing Sheets

CURRENT STEERING DIGITAL-TO-ANALOG (DAC) CONVERTER WITH IMPROVED DYNAMIC PERFORMANCE

FIELD OF THE INVENTION

This invention relates generally to digital-to-analog converters (DACs), and in particular, to a current steering DAC including a control circuit to improve its dynamic performance and output signal quality.

BACKGROUND OF THE INVENTION

FIG. 1 illustrates a schematic diagram of a typical current steering digital-to-analog converter (DAC) 100. The current steering DAC 100 consists of a plurality of segments 110-1 to 110-n for selectively steering current to either the positive output OUTP or the negative output OUTN. Each of the current steering segments, as represented by segment 110n, consists of a current-setting field effect transistor (FET) M1n, a cascode FET M2n, and a pair of differential FETs M3n and M4n.

The current steering DAC 100 may further consists of a thermometer code decoder 120 including a switch driver 122 which receives the binary coded digital input signal that is to be converted into a differential analog signal at the outputs OUTP and OUTN of the current steering DAC 100 and generates the appropriate driving signals D1 to Dn and DB1 to DBn, in response to a conversion clock signal, for respectively controlling the current steering of the current steering segments 110-1 to 110-n. For instance, as the value of the input digital signal increases, the thermometer code decoder 120 generates binary signals D1 to Dn and DB1 to DBn to cause more current steering segments 110-1 to 110n to steer current to the positive output of the DAC 100. Conversely, as the value of the input digital signal decreases, the thermometer code decoder 120 generates binary signals D1 to Dn and DB1 to DBn to cause less current steering segments 110-1 to 110n to steer current to the positive output of the DAC 100.

More specifically, the source of each of the current-setting FETs M1n is connected to a power supply terminal AVDD, the gate of each of the current-setting FETs M1n receives a control voltage $V_{GATE}$, and the drain of each of the current-setting FETs M1n is connected to the source of the corresponding cascode FET M2n. The gate of each of the cascode FETs M2n receives a control voltage VCASC, and the drain of each of the cascode FETs M2n is connected to the corresponding sources of the differential FET pair M3n and M4n. The gates of each of the differential FET pair M3n and M4n respectively receive the corresponding control signals Dn and DBn generated by the thermometer code decoder 120. The drains of each of the differential FET pair M3n and M4n are coupled respectively to the positive output OUTP and negative output OUTN of the current steering DAC 100.

The control voltage $V_{GATE}$ sets the current through each of the current steering segments 110-1 to 110-n. The control voltage $V_{CASC}$ sets the drain-to-source voltage of the current-setting FETs M1 to M1n in a manner that the output impedances of the current steering segments 110-1 to 110-n are relatively high. The control signals Dn and DBn causes the corresponding differential FET pairs M3n and M4n to steer the current to either the positive output OUTP or the negative output OUTN. For example, if the control signal Dn is a logic high and DBn is a logic low, differential FET M3n is turned "off" and differential FET M4n is turned "on". Accordingly, the current in the corresponding current steering segment 110n is steered to the negative output OUTN of the DAC 100. Conversely, if the control signal Dn is a logic low and DBn is a logic high, differential FET M3n is turned "on" and differential FET M4n is turned "off". Accordingly, the current in the corresponding current steering segment 110n is steered to the positive output OUTP of the DAC 100.

A drawback of the current steering DAC 100 stems from the fact that as a current steering segment 110n changes the current steering between the positive and negative outputs OUTP and OUTN (which are typically at different voltage levels), the voltage at the summing node Sn (at the sources of the differential FET pair M3n and M4n) shifts due to the finite intrinsic gain of the differential FET pair M3n and M4n. The shifting of the voltage at the summing node Sn is proportional to the voltage difference between the voltages on the positive and negative outputs OUTP and OUTN of the DAC 100. When this voltage shifts, the capacitance at the summing node Sn has to be recharged. The charge flowing to the capacitance affects the converter output signal, and creates harmonic distortion. This distortion is more prevalent at higher output tone frequency. Thus, the dynamic range of the DAC 100, typically referred to in the art as the Spurious Free Dynamic Range (SFDR), is limited by the shifting voltage at the summing node Sn.

Accordingly, there is a need for an apparatus and method which reduces the variation of the voltage at each of the summing nodes to improve the dynamic range and output signal quality of the DAC. Such need and other are addressed in the detailed description of the invention as follows.

SUMMARY OF THE INVENTION

An aspect of the invention relates to a current steering digital-to-analog (DAC) having improved dynamic performance and output signal quality. The current steering DAC comprises a plurality of current steering segments each including differential transistors to steer a current from a summing node to either a positive output or negative output of the DAC. The current steering DAC further comprises a control circuit to reduce a variation of a voltage present at the summing node of each of the current steering segments. By reducing the variation in the summing node voltages, improved dynamic performance and output signal quality can be achieved.

More specifically, the control circuit comprises a first control circuit to reduce the variation of the voltage present at the summing node of each of the current steering segments that are currently steering current to the positive output in response to the voltage present at the positive output of the DAC. In addition, the control circuit comprises a second control circuit to reduce the variation of the voltage present at the summing node of each of the current steering segments that are currently steering current to the negative output in response to the voltage present at the negative output of the DAC.

The first control circuit may comprise an operational amplifier including positive and negative input terminals and an output terminal, wherein the output terminal is coupled to the substrate (i.e. bulk) terminals of the differential transistors that are electrically connected to the positive output; a reference voltage source coupled to the positive input terminal of the operational amplifier; and a field effect transistor (FET) including a source electrically connected to the negative input terminal of the operational amplifier, a drain electrically connected to the positive output of the DAC, a gate electrically connected to ground, and a substrate (i.e. bulk) terminal electrically connected to the output terminal of the operational amplifier. The operational amplifier generates a voltage that controls the threshold voltages of the differential transistors that are electrically connected to the positive output of the DAC in a manner that the voltages at the respective summing nodes of the current steering segments currently steering currents to the positive output of the DAC are substantially constant.

The second control circuit may comprise an operational amplifier including positive and negative input terminals and an output terminal, wherein the output terminal is coupled to the substrate (i.e. bulk) terminals of the differential transistors that are electrically connected to the negative output of the DAC; a reference voltage source coupled to the positive input terminal of the operational amplifier; and a FET including a source electrically connected to the negative input terminal of the operational amplifier, a drain electrically connected to the negative output of the DAC, a gate electrically connected to ground, and a substrate (i.e. bulk) terminal electrically connected to the output terminal of the operational amplifier. The operational amplifier generates a voltage that controls the threshold voltages of the differential transistors that are electrically connected to the negative output of the DAC in a manner that the voltages at the respective summing nodes of the current steering segments currently steering currents to the negative output of the DAC are substantially constant.

To maintain the summing node voltages substantially constant in a preferred way, the FETs of the current steering segments are sized and laid out such that they comprise fingers of the same length and width as the FETs of the first and second control circuits. In addition, the drain currents of the control circuit FETs are set such that their current per finger is substantially the same as in the current steering segments' FETs.

Another aspect relates to a method of converting an input digital signal to a differential analog output signal. The method comprises steering currents from respective summing nodes to positive and/or negative outputs of a DAC in response to the input digital signal to generate a differential analog output signal; and reducing the variations of the voltages present respectively at the summing nodes. Again, by reducing the variation in the summing node voltages, improved dynamic performance and output signal quality can be achieved.

The reducing of the variation of the summing node voltages may comprise sensing a variation of the voltage at the positive output; and reducing the variations of the voltages at a portion of the summing nodes in response to the variation of the voltage at the positive output. More specifically, this may entail comparing the voltage at the positive output with a substantially constant voltage; and reducing the variations of the voltages at the portion of the summing nodes in response to an outcome of the comparison. This may further entail providing differential transistors to steer the currents from respective summing nodes to the positive output, and controlling the threshold voltages of the differential transistors electrically connected to the positive output.

Similarly, the reducing of the variations of the summing node voltages may comprise sensing a variation of the voltage at the negative output; and reducing the variations of the voltage at a portion of the summing nodes in response to the variation of the voltage at the negative output. More specifically, this may entail comparing the voltage at the negative output with a substantially constant voltage; and reducing the variations of the voltages at a portion of the summing nodes in response to an outcome of the comparison. This may further entail providing differential transistors to steer the currents from respective summing nodes to the negative output, and controlling the threshold voltages of the differential transistors electrically connected to the negative output.

Other aspects, features, and techniques of the invention will be apparent to one skilled in the relevant art in view of the following detailed description of the invention.

DETAILED DESCRIPTION OF THE INVENTION

Figure 1:
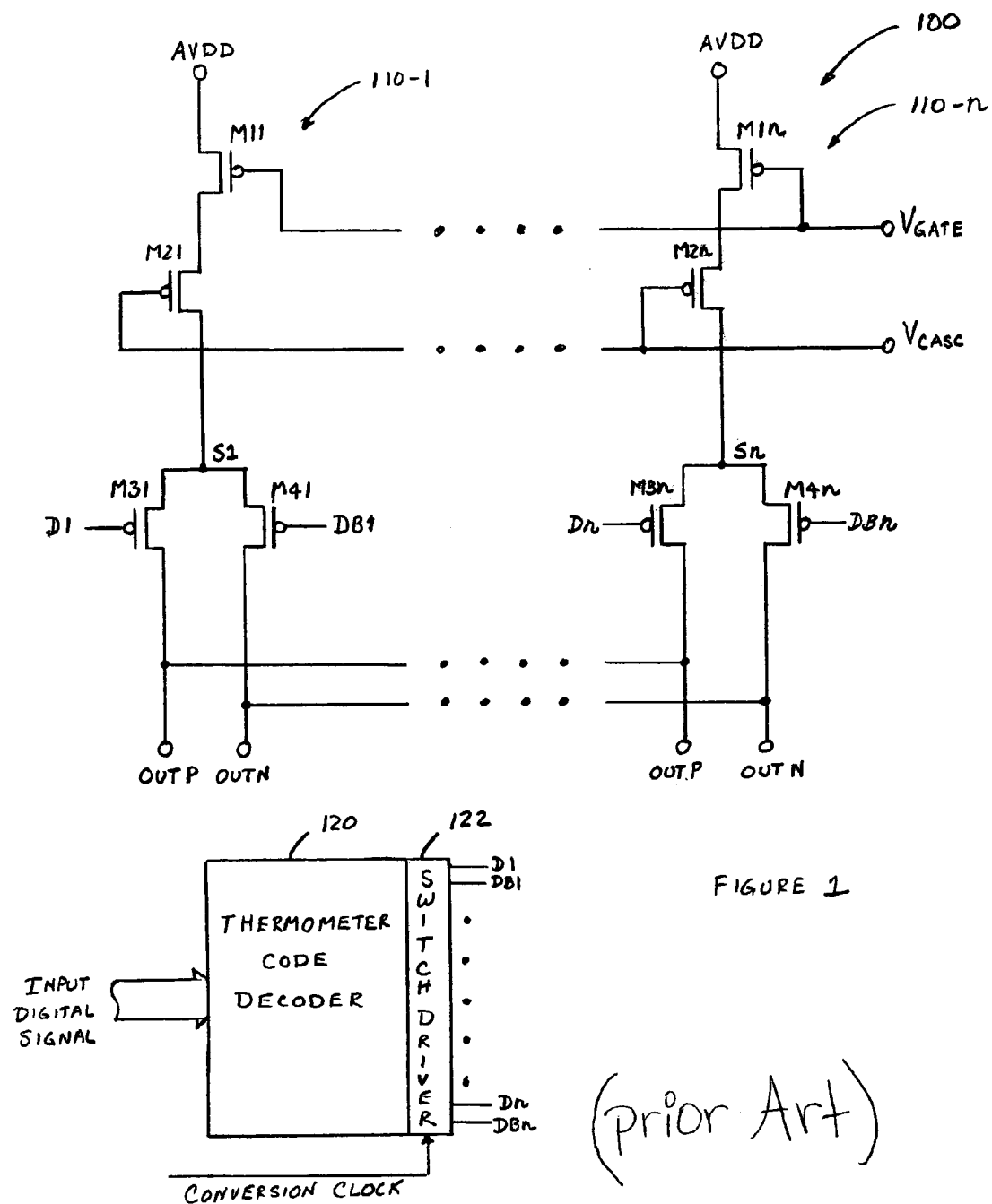
FIG. 1 illustrates a schematic diagram of a typical current steering digital-to-analog converter (DAC)
Figure 2:
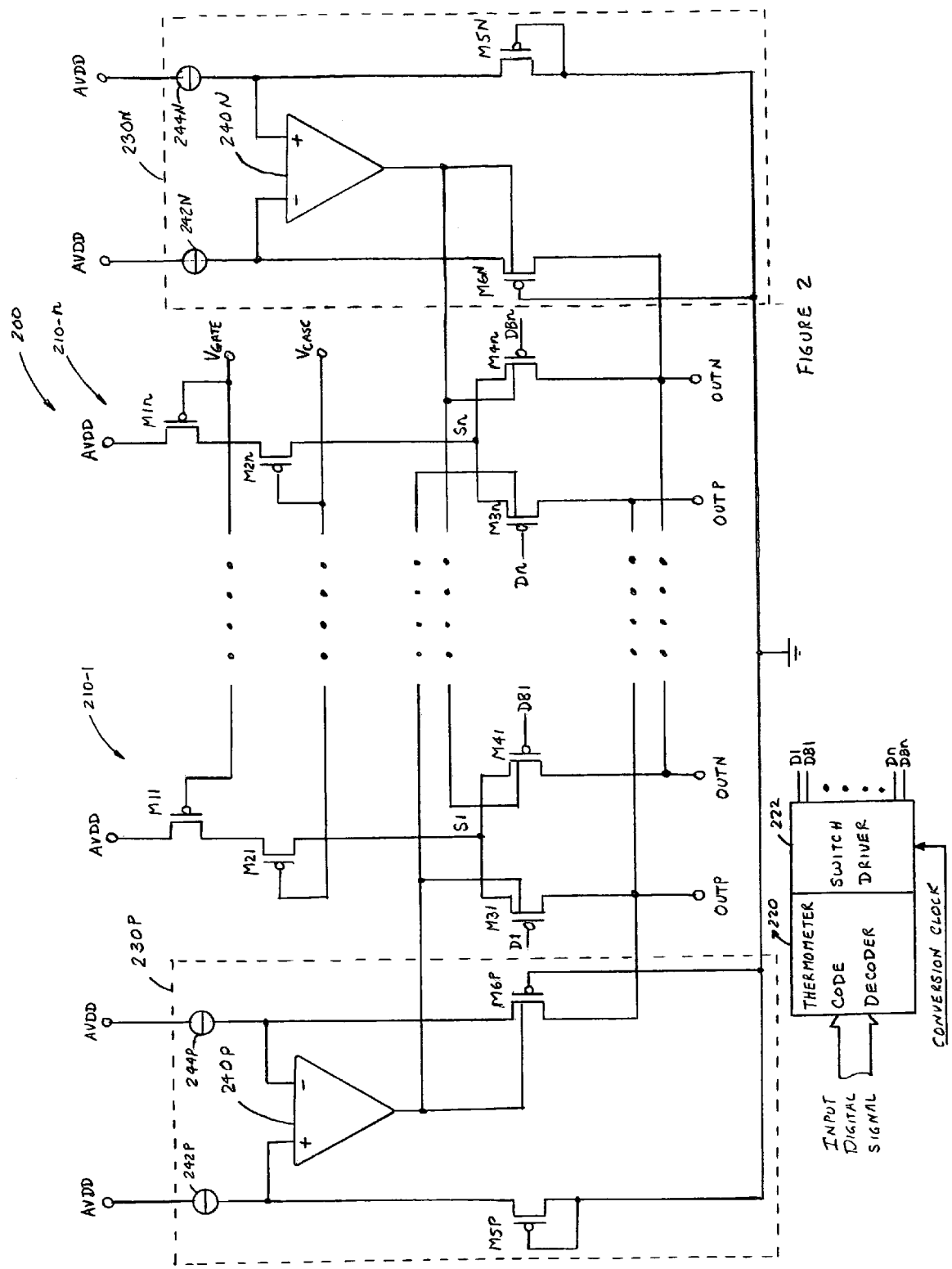
FIG. 2 illustrates a schematic diagram of an exemplary current steering digital-to-analog converter (DAC) in accordance with an embodiment of the invention.

FIG. 2 illustrates a schematic diagram of an exemplary current steering digital-to-analog converter (DAC) 200 in accordance with an embodiment of the invention. The current steering DAC 200 comprises a plurality of segments 210-1 to 210-$n$ for selectively steering current to either the positive output OUTP or the negative output OUTN, respectively. Each of the current steering segments, as represented by segment 210$n$, comprises a current-setting field effect transistor (FET) M1$n$, a cascode FET M2$n$, and a pair of differential FETs M3$n$ and M4$n$.

The current steering DAC 200 may further comprise a thermometer code decoder 220 including a switch driver 222 which receives the binary coded digital input signal that is to be converted into a differential analog signal at the outputs OUTP and OUTN of the current steering DAC 200 and generates the appropriate driving signals D1 to Dn and DB1 to DBn, in response to a conversion clock signal, for respectively controlling the current steering of the current steering segments 210-1 to 210-$n$.

The source of each of the current-setting FETs M1$n$ is connected to a power supply terminal AVDD, the gate of each of the current-setting FETs M1$n$ receives a control voltage $V_{GATE}$, and the drain of each of the current-setting FETs M1$n$ is connected to the source of the corresponding cascode FET M2$n$. The gate of each of the cascode FETs M2$n$ receives a control voltage $V_{CASC}$, and the drain of each of the cascode FETs M2$n$ is connected to the corresponding sources of the differential FET pair M3$n$ and M4$n$. The gates of each of the differential FET pair M3$n$ and M4$n$ respectively receive the corresponding control signals Dn and DBn generated by the thermometer code decoder 220. The drains of each of the differential FET pair M3$n$ and M4$n$ are coupled respectively to the positive output OUTP and negative output OUTN of the current steering DAC 200.

The control voltage $V_{GATE}$ sets the current through each of the current steering segments 210-1 to 210-$n$. The control voltage $V_{CASC}$ sets the drain-to-source voltage of the current-setting FETs M11 to M1$n$ in a manner that the output impedances of the current steering segments 210-1 to 210-$n$ are relatively high. The control signals Dn and DBn causes the corresponding differential FET pairs M3$n$ and M4$n$ to steer the current to either the positive output OUTP or the negative output OUTN.

As discussed in the Background Section, the variations of the voltages present at the summing nodes Sn as the corresponding differential FET pairs M3n and M4n are switched, have adverse effects on the dynamic range and signal quality of the output of the current steering DAC. In other words, such variation degrade or limit the SFDR characteristic of a DAC. To alleviate this problem, the current steering DAC 200 in accordance with the invention further includes a control circuit to reduce the variation of the voltages at the summing nodes Sn, thereby improving the dynamic performance and signal quality of the output of the current steering DAC 200.

In particular, the current steering DAC 200 further comprises a first control circuit 230P responsive to the voltage at the positive output OUTP to control the threshold voltages of FETs M31 to M3n (the transistors connected to the positive output OUTP) such that the variations of the voltages at the summing nodes Sn are substantially reduced. Similarly, the current steering DAC 200 further comprises a second control circuit 230N responsive to the voltage at the negative output OUTN to control the threshold voltages of FETs M41 to M4n such that the variations of the voltages at the summing nodes Sn are substantially reduced.

More specifically, the first control circuit 230P comprises an operational amplifier 240P and FETs M5P and M6P. FET M5P includes a source electrically connected to the positive input terminal of the operational amplifier 240P and to the power supply terminal AVDD by way of a current source 242P, and a gate and drain electrically connected to a ground terminal. FET M6P includes a source electrically connected to the negative input terminal of the operational amplifier 240P and to the power supply terminal AVDD by way of a current source 244P (a resistor, FET or other device), a gate electrically connected to the ground terminal, and a drain electrically connected to the positive output OUTP of the current steering DAC 200. The FET6P further includes a substrate terminal (i.e. bulk terminal) electrically connected to the output of the operational amplifier 240P.

Similarly, the second control circuit 230N comprises an operational amplifier 240N and FETs M5N and M6N. FET M5N includes a source electrically connected to the positive input terminal of the operational amplifier 240N and to the power supply terminal AVDD by way of a current source 244N (a resistor, FET or other device), and a gate and drain electrically connected to the ground terminal. FET M6N includes a source electrically connected to the negative input terminal of the operational amplifier 240N and to the power supply terminal AVDD by way of a current source 242N, a gate electrically connected to the ground terminal, and a drain electrically connected to the negative output OUTN of the current steering DAC 200. The FET6N further includes a substrate terminal (i.e. bulk terminal) electrically connected to the output of the operational amplifier 240N.

The operation of the first control circuit 230P is discussed as follows. FET M5P is diode-connected between the power supply terminal AVDD by way of the current source 242P, and ground terminal, thereby providing a substantially constant reference voltage to the positive input of the operational amplifier 240P. The voltage at the source of FET M6P, which is susceptible to variation due to variation of the voltage at the positive output OUTP of the current steering DAC 200, is applied to the negative input terminal of the operational amplifier 240P, and thereby provides negative feedback for the control operation. The operational amplifier 240P produces a voltage that controls the threshold voltage of the FET M6P in a manner that the source voltage of FET M6P is substantially constant. In other words, the control of the threshold voltage changes the gate-to-source voltage relationship of the FET M6P such that its source voltage remains substantially constant. The output of the operational amplifier 240P is also coupled to the substrates (i.e. bulk) of FETs M31 to M3n, thereby also controlling their threshold voltages in a similar manner, i.e. such that their source voltages (i.e. the voltages at the summing nodes Sn) are maintained substantially constant.

To maintain the source voltages of FETs M31 to M3n substantially constant in a preferred way, the FETs M31 to M3n are sized and laid out such that they comprise fingers of substantially the same length and width as FET M6P. The drain current of FET M6P is set such that the current per finger in FET M6P is substantially the same as in FETs M31 to M3n. For preferred circuit operation, FET M5P has substantially the same size and drain current as FET M6P.

Similarly for the second control circuit 230N, FET M5N is diode-connected between the power supply terminal AVDD by way of the current source 244N, and ground terminal, thereby providing a substantially constant reference voltage to the positive input of the operational amplifier 240N. The voltage at the source of FET M6N, which is susceptible to variation due to variation of the voltage at the negative output OUTN of the current steering DAC 200, is applied to the negative input terminal of the operational amplifier, and thereby provides negative feedback for the control operation. The operational amplifier 240N produces a voltage that controls the threshold voltage of the FET M6N in a manner that the source voltage of FET M6N is substantially constant. In other words, the control of the threshold voltage changes the gate-to-source voltage relationship of the FET M6N such that its source voltage remains substantially constant. The output of the operational amplifier 240N is also coupled to the substrates (i.e. bulk) of FETs M41 to M4n, thereby also controlling their threshold voltages in a similar manner, i.e. such that their source voltages (i.e. the voltages at the summing nodes Sn) are maintained substantially constant.

To maintain the source voltages of FETs M41 to M4n substantially constant in a preferred way, the FETs M41 to M4n are sized and laid out such that they comprise fingers of substantially the same length and width as FET M6N. The drain current of FET M6N is set such that the current per finger in FET M6N is substantially the same as in FETs M41 to M4n. For preferred circuit operation, FET M5N has the substantially same size and drain current as FET M6N.

The reduction in the variation of the voltages at the respective summing nodes Sn improves the dynamic performance and signal quality of the output of the current steering DAC 200 (i.e. improves the SFDR characteristic of the DAC 200). Thus, the current steering DAC 200 in accordance with the invention can be made to operate at higher frequencies and at the same time produce a differential output voltage with improved signal quality.

Although the exemplary embodiment of the current steering DAC 200 illustrated includes p-type FETs, it shall be understood that n-type FETs can also be used in place thereof. In addition, the current steering DAC 200 need not be limited to FET technology, but other transistor technologies can also be used, such as bipolar technology. Furthermore, a particular implementation of the first and second control circuit is illustrated, it shall be understood that other implementations for reducing the variations of the voltages at the summing nodes are within the scope of the invention.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

It is claimed:

1. A current steering digital-to-analog (DAC), comprising:
    a plurality of current steering segments each comprising differential transistors to steer a current from a summing node to either a positive output or a negative output of said DAC; and
    a control circuit to reduce a variation of a voltage present at the summing node of each of said current steering segments in response to a difference in the voltages present at the positive and negative outputs, and the switching of at least one of said differential transistors.

2. The current steering DAC of claim 1, wherein said control circuit comprises a first control circuit to reduce said variation of said voltage present at the summing node of each of said current steering segments steering current to said positive output in response to said voltage present at said positive output.

3. The current steering DAC of claim 2, wherein said control circuit comprises a second control circuit to reduce said variation of said voltage present at the summing node of each of said current steering segments steering current to said negative output in response to said voltage present at said negative output.

4. The current steering DAC of claim 2, wherein said first control circuit comprises:
    an operational amplifier including first and second input terminals and an output terminal, wherein said output terminal is electrically connected to a substrate terminal of the differential transistor, that is electrically connected to the positive output, of each of said current steering segments;
    a reference voltage source electrically connected to said first input terminal of said operational amplifier; and
    a transistor including a first terminal electrically connected to said second input terminal of said operational amplifier, a second terminal electrically connected to said positive output, a control terminal electrically connected to a constant-voltage terminal, and a substrate terminal electrically connected to said output terminal of said operational amplifier.

5. The current steering DAC of claim 4, wherein said transistor comprises fingers of substantially the same length and width as the differential transistors that are electrically connected to said positive output of said DAC.

6. The current steering DAC of claim 4, wherein said transistor is configured to have substantially the same drain current as the differential transistors that are electrically connected to said positive output of said DAC.

7. The current steering DAC of claim 4, wherein said first input terminal of said operational amplifier comprises a positive input terminal of said operational amplifier, and said second input terminal of said operational amplifier comprises a negative input terminal of said operational amplifier.

8. The current steering DAC of claim 4, wherein said reference voltage source comprises a diode-connected transistor electrically connected between said first input terminal and said constant-voltage terminal.

9. The current steering DAC of claim 8, wherein said transistor and said diode-connected transistor are FETs, and wherein said diode-connected transistor is substantially the same size and configured to have substantially the same drain current as said transistor.

10. The current steering DAC of claim 8, wherein said diode-connected transistor comprises a field effect transistor (FET).

11. The current steering DAC of claim 4, wherein said transistor comprises a field effect transistor (FET).

12. The current steering DAC of claim 11, wherein said first terminal of said FET comprises a source terminal of said FET, said second terminal of said FET comprises a drain terminal of said FET, and said control terminal of said FET comprises a gate terminal of said FET.

13. The current steering DAC of claim 4, wherein said constant-voltage terminal comprises a ground terminal.

14. The current steering DAC of claim 3, wherein said second control circuit comprises:
    an operational amplifier including first and second input terminals and an output terminal, wherein said output terminal is electrically connected to a substrate terminal of the differential transistor, that is electrically connected to the negative output, of each of said current steering segments;
    a reference voltage source electrically connected to said first input terminal of said operational amplifier; and
    a transistor including a first terminal electrically connected to said second input terminal of said operational amplifier, a second terminal electrically connected to said negative output, a control terminal electrically connected to a constant-voltage terminal, and a substrate terminal electrically connected to said output terminal of said operational amplifier.

15. The current steering DAC of claim 14, wherein said transistor comprises fingers of substantially the same length and width as the differential transistors that are electrically connected to said negative output of said DAC.

16. The current steering DAC of claim 14, wherein said transistor is configured to have substantially the same drain current as the differential transistors that are electrically connected to said negative output of said DAC.

17. The current steering DAC of claim 14, wherein said first input terminal of said operational amplifier comprises a positive input terminal of said operational amplifier, and said second input terminal of said operational amplifier comprises a negative input terminal of said operational amplifier.

18. The current steering DAC of claim 14, wherein said reference voltage source comprises a diode-connected transistor electrically connected between said first input terminal and said constant-voltage terminal.

19. The current steering DAC of claim 18, wherein said transistor and said diode-connected transistor are FETs, and wherein said diode-connected transistor is substantially the same size and configured to have substantially the same drain current as said transistor.

20. The current steering DAC of claim 18, wherein said diode-connected transistor comprises a field effect transistor (FET).

21. The current steering DAC of claim 14, wherein said transistor comprises a field effect transistor (FET).

22. The current steering DAC of claim 21, wherein said first terminal of said FET comprises a source terminal of said FET, said second terminal of said FET comprises a drain terminal of said FET, and said control terminal of said FET comprises a gate terminal of said FET.

23. The current steering DAC of claim 14, wherein said constant-voltage terminal comprises a ground terminal.

24. The current steering DAC of claim 1, wherein said control circuit comprises a first control circuit to reduce said variation of said voltage present at the summing node of each of said current steering segments steering current to said negative output in response to a voltage present at said negative output.

25. The current steering DAC of claim 1, wherein each of said current steering segments comprises a current-setting transistor for setting said current through said corresponding current setting transistor.

26. The current steering DAC of claim 25, wherein each of said current steering segments comprises a cascode transistor for setting a drain-to-source voltage of said corresponding current steering segment.

27. The current steering DAC of claim 1, further comprising a thermometer code decoder to generate signals for controlling the current steering of each of said current steering segments in response to an input digital signal.

28. A method of converting an input digital signal to a differential analog output signal, comprising:
   steering currents from respective summing nodes to positive and/or negative outputs in response to said input digital signal to generate said differential analog output signal; and
   reducing variations of voltages present respectively at said summing nodes in response to a difference in the voltages present at the positive and negative outputs and to a change in the steering of at least one of said currents between the positive and negative outputs.

29. The method of claim 28, wherein reducing said variations of voltages present respectively at a portion of said summing nodes comprises:
   sensing a variation of said voltage at said positive output; and
   reducing said variations of the voltages at said portion of said summing nodes in response to said variation of said voltage at said positive output.

30. The method of claim 28, wherein reducing said variations of the voltages at said portion of said summing nodes comprises:
   comparing said voltage at said positive output with a substantially constant voltage; and
   reducing said variations of the voltages at said portion of said summing nodes in response to an outcome of said comparison.

31. The method of claim 28, wherein steering currents from respective summing nodes to positive and/or negative outputs comprises employing differential transistors to steer said currents from respective summing nodes.

32. The method of claim 31, wherein reducing said variations of the voltages at said portion of said summing nodes in response to said variation of said voltage at said positive output comprises controlling a threshold voltage of one or more differential transistors electrically connected to said positive output.

33. The method of claim 32, wherein controlling said threshold voltage of one or more differential transistors electrically connected to said positive output comprises:
   generating a differential voltage responsive to a difference between said voltage at said positive output and a substantially constant voltage; and
   controlling said threshold voltage of one or more differential transistors electrically connected to said positive output using said differential voltage.

34. The method of claim 28, wherein reducing said variations of said voltages present respectively at a portion of said summing nodes comprises:
   sensing a variation of said voltage at said negative output; and
   reducing said variation of the voltages at said portion of said summing nodes in response to said variation of said voltage at said negative output.

35. The method of claim 34, wherein reducing said variations of the voltages said portion of said summing nodes comprises:
   comparing said voltage at said negative output with a substantially constant voltage; and
   reducing said variations of the voltages at a portion of said summing nodes in response to an outcome of said comparison.

36. The method of claim 28, wherein steering currents from respective summing nodes to positive and/or negative outputs comprises employing differential transistors to steer said currents from respective summing nodes.

37. The method of claim 36, wherein reducing said variations of the voltages at said portion of said summing nodes in response to said variation of said voltage at said negative output comprises controlling a threshold voltage of one or more differential transistors electrically connected to said negative output.

38. The method of claim 37, wherein controlling said threshold voltage of one or more differential transistors electrically connected to said negative output comprises:
   generating a differential voltage responsive to a difference between said voltage at said negative output and a substantially constant voltage; and
   controlling said threshold voltage of one or more differential transistors electrically connected to said negative output using said differential voltage.

39. The method of claim 28, further comprising setting and controlling respective steering currents.

40. The method of claim 28, further comprising adjusting respective output impedances of said positive and negative outputs.

41. A current steering digital-to-analog (DAC), comprising:
   a plurality of current steering segments each comprising differential transistors to steer a current from a summing node to either a positive output or a negative output of said DAC; and
   a control circuit to reduce a variation of a voltage present at the summing node of each of said current steering segments, wherein said control circuit comprises a first control circuit to reduce said variation of said voltage present at the summing node of each of said current steering segments steering current to said positive output in response to a voltage present at said positive output;
   wherein said first control circuit comprises:
      an operational amplifier including first and second input terminals and an output terminal, wherein said output terminal is electrically connected to a substrate terminal of the differential transistor that is electrically connected to the positive output of each of said current steering segments;
      a reference voltage source electrically connected to said first input terminal of said operational amplifier; and
      a transistor including a first terminal electrically connected to said second input terminal of said operational amplifier, a second terminal electrically connected to said positive output, a control terminal electrically connected to a constant-voltage terminal, and a substrate terminal electrically connected to said output terminal of said operational amplifier;

wherein said reference voltage source comprises a diode-connected transistor electrically connected between said first input terminal and said constant-voltage terminal.

42. The current steering DAC of claim 41, wherein said transistor and said diode-connected transistor are FETs, and wherein said diode-connected transistor is substantially the same size and configured to have substantially the same drain current as said transistor.

43. The current steering DAC of claim 41, wherein said diode-connected transistor comprises a field effect transistor (FET).

44. A current steering digital-to-analog (DAC), comprising:
   a plurality of current steering segments each comprising differential transistors to steer a current from a summing node to either a positive output or a negative output of said DAC; and
   a control circuit to reduce a variation of a voltage present at the summing node of each of said current steering segments, wherein said control circuit comprises a first control circuit to reduce said variation of said voltage present at the summing node of each of said current steering segments steering current to said positive output in response to a voltage present at said positive output, and a second control circuit to reduce said variation of said voltage present at the summing node of each of said current steering segments steering current to said negative output in response to a voltage present at said negative output;

wherein said second control circuit comprises:
   an operational amplifier including first and second input terminals and an output terminal, wherein said output terminal is electrically connected to a substrate terminal of the differential transistor that is electrically connected to the negative output of each of said current steering segments;
   a reference voltage source electrically connected to said first input terminal of said operational amplifier; and
   a transistor including a first terminal electrically connected to said second input terminal of said operational amplifier, a second terminal electrically connected to said negative output, a control terminal electrically connected to a constant-voltage terminal, and a substrate terminal electrically connected to said output terminal of said operational amplifier;
   wherein said reference voltage source comprises a diode-connected transistor electrically connected between said first input terminal and said constant-voltage terminal.

45. The current steering DAC of claim 44, wherein said transistor and said diode-connected transistor are FETs, and wherein said diode-connected transistor is substantially the same size and configured to have substantially the same drain current as said transistor.

46. The current steering DAC of claim 44, wherein said diode-connected transistor comprises a field effect transistor (FET).

* * * * *